US012403547B2

(12) United States Patent
Vergeer et al.

(10) Patent No.: US 12,403,547 B2
(45) Date of Patent: Sep. 2, 2025

(54) METHOD FOR CONTROLLING STRESS IN A SUBSTRATE DURING LASER DEPOSITION

(71) Applicant: LAM RESEARCH CORPORATION, Fremont, CA (US)

(72) Inventors: Kurt Hein Vergeer, Waalre (NL); Jeroen Aaldert Heuver, Enschede (NL); Willem Cornelis Lambert Hopman, Deventer (NL); Kristiaan Hendrikus Aloysius Böhm, Deventer (NL); Jan Matthijn Dekkers, Aadorp (NL); Jan Arnaud Janssens, Schalkhaar (NL)

(73) Assignee: LAM RESEARH CORPORATION, Fremont, CA (US)

( * ) Notice: Subject to any disclaimer, the term of this patent is extended or adjusted under 35 U.S.C. 154(b) by 430 days.

(21) Appl. No.: 17/331,735

(22) Filed: May 27, 2021

(65) Prior Publication Data

US 2021/0370435 A1  Dec. 2, 2021

(30) Foreign Application Priority Data

May 28, 2020  (EP) ..................................... 20177146

(51) Int. Cl.
*B23K 26/00* (2014.01)
*B23K 26/03* (2006.01)
(Continued)

(52) U.S. Cl.
CPC ........ *B23K 26/0006* (2013.01); *B23K 26/034* (2013.01); *B23K 26/035* (2015.10);
(Continued)

(58) Field of Classification Search
CPC .............. B23K 26/0006; B23K 26/035; B23K 26/1436; B23K 26/034; B23K 2101/36; B81C 1/00365; H03H 2003/028
See application file for complete search history.

(56) References Cited

U.S. PATENT DOCUMENTS 5,622,567 A * 4/1997 Kojima ............... C23C 14/3471
427/596
6,156,623 A   12/2000 Hendrix et al.
(Continued)

FOREIGN PATENT DOCUMENTS

EP  2347993 A2  7/2011
EP  3647458 A1  5/2020
(Continued)

OTHER PUBLICATIONS

Taiwan Intellectual Property Office, Office Action Issued in Application No. 110118399, Mar. 5, 2025, 21 pages.
(Continued)

*Primary Examiner* — Steven W Crabb
*Assistant Examiner* — Theodore J Evangelista
(74) *Attorney, Agent, or Firm* — Alleman Hall & Tuttle LLP

(57) ABSTRACT

The invention relates to a method for controlling stress in a substrate during laser deposition. The method includes the steps of: providing a laser deposition device including a chamber with a target holder with a target, a substrate holder with a substrate facing the target and a window, the laser deposition device further including a laser beam directed through the window of the chamber onto a spot at the target for generating a plasma plume of target material and depositing the target material onto a surface portion of the substrate in order to form a thin film of target material, wherein the target spot is movable relative to the substrate in order to deposit target material onto a plurality of surface (Continued)

portions of the substrate; defining a plurality of discrete surface portions on the substrate; aligning the target spot one after the other with each of the plurality of discrete surface portions and generating a plasma plume to deposit target material on each of the plurality of discrete surface portions; and adjusting at least one of the parameters of the deposition process depending on the discrete surface portion with which the target spot is aligned, which parameters include temperature, pressure, laser beam pulse duration, laser beam power, distance of target to substrate.

20 Claims, 4 Drawing Sheets

(51) Int. Cl.
| | | |
|---|---|---|
| *B23K 26/035* | (2014.01) | |
| *B23K 26/14* | (2014.01) | |
| *B23K 101/36* | (2006.01) | |
| *B81C 1/00* | (2006.01) | |
| *C23C 14/22* | (2006.01) | |
| *H01L 21/02* | (2006.01) | |
| *H03H 3/02* | (2006.01) | |

(52) U.S. Cl.
CPC ........ *B23K 26/1436* (2015.10); *C23C 14/228* (2013.01); *B23K 2101/36* (2018.08); *B81C 1/00365* (2013.01); *H01L 21/02104* (2013.01); *H03H 2003/028* (2013.01)

(56) References Cited

U.S. PATENT DOCUMENTS

| | | | |
|---|---|---|---|
| 6,925,346 B1* | 8/2005 | Mazumder | B23K 35/0244 |
| | | | 700/121 |
| 8,058,154 B2 | 11/2011 | Chiang et al. | |
| 8,383,441 B2 | 2/2013 | El Rifai et al. | |
| 9,053,929 B1* | 6/2015 | Huff | C23C 14/3442 |
| 2008/0132089 A1* | 6/2008 | Chiang | H01L 21/67011 |
| | | | 257/E21.001 |
| 2015/0255308 A1* | 9/2015 | Lin | C25D 9/04 |
| | | | 438/479 |
| 2018/0096906 A1 | 4/2018 | Levy et al. | |
| 2018/0147673 A1* | 5/2018 | Schmitt | B22F 1/17 |
| 2019/0353582 A1 | 11/2019 | Vukkadala et al. | |
| 2020/0140993 A1 | 5/2020 | Noh | |

FOREIGN PATENT DOCUMENTS

| | | |
|---|---|---|
| JP | 2017512252 A | 5/2017 |
| TW | 201823507 A | 7/2018 |
| WO | 2007046852 A2 | 4/2007 |
| WO | 2015124589 A1 | 8/2015 |

OTHER PUBLICATIONS

Japan Patent Office, Office Action Issued in Application No. 2021-085798, May 20, 2025, 10 pages.

* cited by examiner

METHOD FOR CONTROLLING STRESS IN A SUBSTRATE DURING LASER DEPOSITION

CROSS-REFERENCE TO RELATED APPLICATION

This application claims priority to European Patent Application No. 20177146.6 filed May 28, 2020, the disclosure of which is hereby incorporated by reference in its entirety.

BACKGROUND OF THE INVENTION

Field of the Invention

The invention relates to a method for controlling stress in a thin film on a substrate during laser deposition.

Description of Related Art

In creating microelectromechanical systems (MEMS) structures or Radio Frequency (RF) acoustic resonators, substrates with one or more thin piezoelectric layers are used. Such layers could be provided by laser deposition, in which a laser beam is directed onto a target spot on a surface of a target material. As a result, a plasma plume of target material is created, which is deposited onto the substrate.

Due to the particle energy in the plasma plume, the deposition rate, the film thickness and physical and chemical incorporation of material stresses occur in the layers on the substrate.

An important part of the stresses in the deposited layers is the intrinsic stress. The intrinsic stress is a structure and microstructure related property, which is the result of the mode of film growth, microstructural interactions and by some contaminations.

These stresses influence the quality of the MEMS structures or RF resonators and it is therefore desired to control the stresses, such that a substrate with deposited layers can be obtained, wherein the stresses are evenly distributed over the surface of the substrate. A uniform stress profile of the deposited layer on the wafer is important to increase the quality and yield of the manufactured MEMS and RF devices, and to reduce the manufacturing costs.

In some other applications, it can also be desired to have specific stress profile, which is not uniform to obtain a specific technical effect in the MEMS structures or RF resonators.

U.S. Pat. No. 6,156,623 describes a technique for physical vapor deposition (PVD) or chemical vapor deposition (CVD) to reduce the stresses in the deposited layers. This publication suggests to bend the substrate during deposition, such that after the deposition of the layer, the substrate bends back and compensates for the stresses introduced by the deposition of the layers. The bending, however, does not allow for local changes in stresses, but only allows for a pre-set global stress to be applied to the layers on the substrate.

EP 2347993 describes a technique to reduce the stresses in layers also deposited by PVD or CVD. In this publication it is proposed to provide an after treatment of the substrate, by locally irradiating the layers on the substrate with a laser beam, such that the layers are locally heated and stresses are reduced. The local heating by laser beam will reduce stresses, but also could change the crystal structure of the material of the layer.

WO 2007046852 describes a method for providing a number of structures or devices on a single substrate. To this end regions are defined on the substrate. As layers of one region may not interdiffuse with the layers of adjacent regions, a sufficient spacing is maintained.

The parameters of the process for arranging a layer within a region are fixed and are only changed between regions, which separate regions do not form a continuous surface.

This publication further discloses that each region can be tested separately for properties such as stress. However, such a test is performed on the full layer of a region, which is bounded by the spacing between adjacent layers. The stress differences within the full layer are not measured or compensated for.

SUMMARY OF THE INVENTION

It is an object of the invention to reduce or even remove the above mentioned disadvantages.

This object is achieved according to the invention with a method for controlling stress in a substrate during laser deposition, which method comprises the steps of:

providing a laser deposition device comprising a chamber with a target holder with a target, a substrate holder with a substrate facing the target and a window, the laser deposition device further comprising a laser beam directed through the window of the chamber onto a spot at the target for generating a plasma plume of target material and depositing the target material onto a surface portion of the substrate in order to form a thin film of target material, wherein the target spot is movable relative to the substrate in order to deposit target material onto a plurality of surface portions of the substrate;

defining a plurality of discrete surface portions on the substrate;

aligning the target spot one after the other with each of the plurality of discrete surface portions and generating a plasma plume to deposit target material on each of the plurality of discrete surface portions;

adjusting at least one of the parameters of the deposition process depending on the discrete surface portion with which the target spot is aligned, which parameters comprise temperature, pressure, laser beam pulse duration, laser beam power, distance of target to substrate, spotsize and RF ionization energy.

With the method according to the invention, the surface of the substrate is divided into a plurality of discrete surface portions and then for each surface portion specific parameters are used to deposit target material at said surface portion.

Because the particle energy in the plasma plume, the deposition rate, the film thickness and physical and chemical incorporation of material all influence the resulting stress in the layers on the substrate, adjusting at least one parameter of the deposition process allows for control of the stress occurring at the specific surface portion of the substrate.

By adjusting at least one of the parameters of the deposition process depending on the discrete surface portion with which the target spot is aligned, a specific deposition pattern can be obtained over the surface of the substrate, which will result in a specific stress pattern over the surface of the substrate and thus can result in a more uniform stress pattern.

If the plasma plume passes the same discrete surface portion more than once, it is within the invention that the parameters of the deposition process could be maintained equal or could be changed for each pass over this discrete surface portion.

In a preferred embodiment of the method according to the invention the plurality of discrete surface portions are defined as a two-dimensional grid, for example in longitudinal and transverse direction or in radial and tangential direction.

Target material is typically deposited on large scale substrates by either moving the substrate, relative to the target spot, in X-Y direction, i.e. in longitudinal and transverse direction, or by rotating the substrate and moving the target spot relative to the substrate in radial direction, i.e. in radial and tangential direction. By having the plurality of discrete surface portions defined in the same directions as the relative movement of the target spot relative to the substrate allows for an easier control.

A further preferred embodiment of the method according to the invention further comprises the steps of:
measuring the stress in the deposited thin film on the substrate;
comparing the stress measurements with a desired stress profile for the thin film; and
taking into account the comparison while adjusting at least one of the parameters of the deposition process.

By measuring the stress in the thin film on the substrate, a more accurate adjustment can be made to the parameters of the depositing process such that the resulting stresses corresponds to the desired stress profile.

Preferably, the stress in the thin film is measured in situ with a stress measuring device, such as a wafer bow meter. This allows for a direct feedback to the adjustment of the parameters of the depositing process.

Another embodiment of the method according to the invention comprises the steps of:
depositing target material on a first substrate, while maintaining the parameters of the deposition process constant;
measuring ex situ the stress in the deposited thin film on the first substrate;
calculating adjustments per discrete surface portion based on the stress measurements;
performing the steps of claim 1 on a second substrate, while using the calculated adjustments in the step of adjusting at least one of the parameters of the deposition process depending on the discrete surface portion with which the target spot is aligned.

In this embodiment, a first substrate is provided with the deposition of the target material under constant parameters of the deposition process. Then the substrate is taken out of the deposition device and the stress in the deposited thin film on the substrate is measured. Based on the measured stresses in the thin film on the first substrate adjustments to the parameters for each of the discrete surface portions are calculated. Then a second substrate is provided with the deposition of target material, wherein for each discrete surface portion the parameters of the deposition process are adjusted accordingly to the calculated adjustments. The resulting second thin film on the substrate will have a different stress profile over the whole surface of the substrate, which will correspond more to the desired stress profile. If required, the second substrate could also be measured outside of the deposition device to further enhance the calculated adjustments of the parameters for the deposition process.

In yet another preferred embodiment of the method according to the invention the temperature of the substrate at the discrete surface portion with which the target spot is aligned is controlled by irradiating the substrate with a laser beam.

Another option is to provide the heater, which is typically arranged in a laser deposition device underneath the substrate, with a number of separately controllable heating elements, such that parts of the substrate can be heated differently.

It is known to keep the whole substrate at a certain temperature during the deposition process. By irradiating the substrate with a laser beam, local temperature changes can be induced, such that the temperature of the discrete surface portion with which the target spot is aligned can be increased relative to the overall temperature of the substrate.

In still a further embodiment of the method according to the invention the laser deposition device further comprises at least one nozzle, directed towards the discrete surface portion with which the target spot is aligned, and wherein the nozzle is supplied with a controlled gas flow in order to adjust the pressure for the deposition process.

Typically, the chamber of the laser deposition device is kept at a certain pressure, typically almost vacuum. This allows for the plasma plume to travel without any interference from the target to the substrate. It is also known to have a certain type of gas in the chamber in order to enhance the deposited layer by letting the gas to mix with the plasma.

By providing at least one nozzle, directed towards the discrete surface portion with which the target spot is aligned, the local pressure around the discrete surface portion could be varied relative to the overall pressure in the chamber. The at least one nozzle also allows for the introduction of another type of gas, which mixes with the plasma plume and can result in other material properties for the deposited layer.

In order to adjust the parameters of the depositing process it is also possible to add more plasma plumes, change the spot size on the target or to physically shield part of the plasma plume.

BRIEF DESCRIPTION OF THE DRAWINGS

These and other features of the invention will be elucidated in conjunction with the accompanying drawings.

DESCRIPTION OF THE INVENTION

Figure 1:
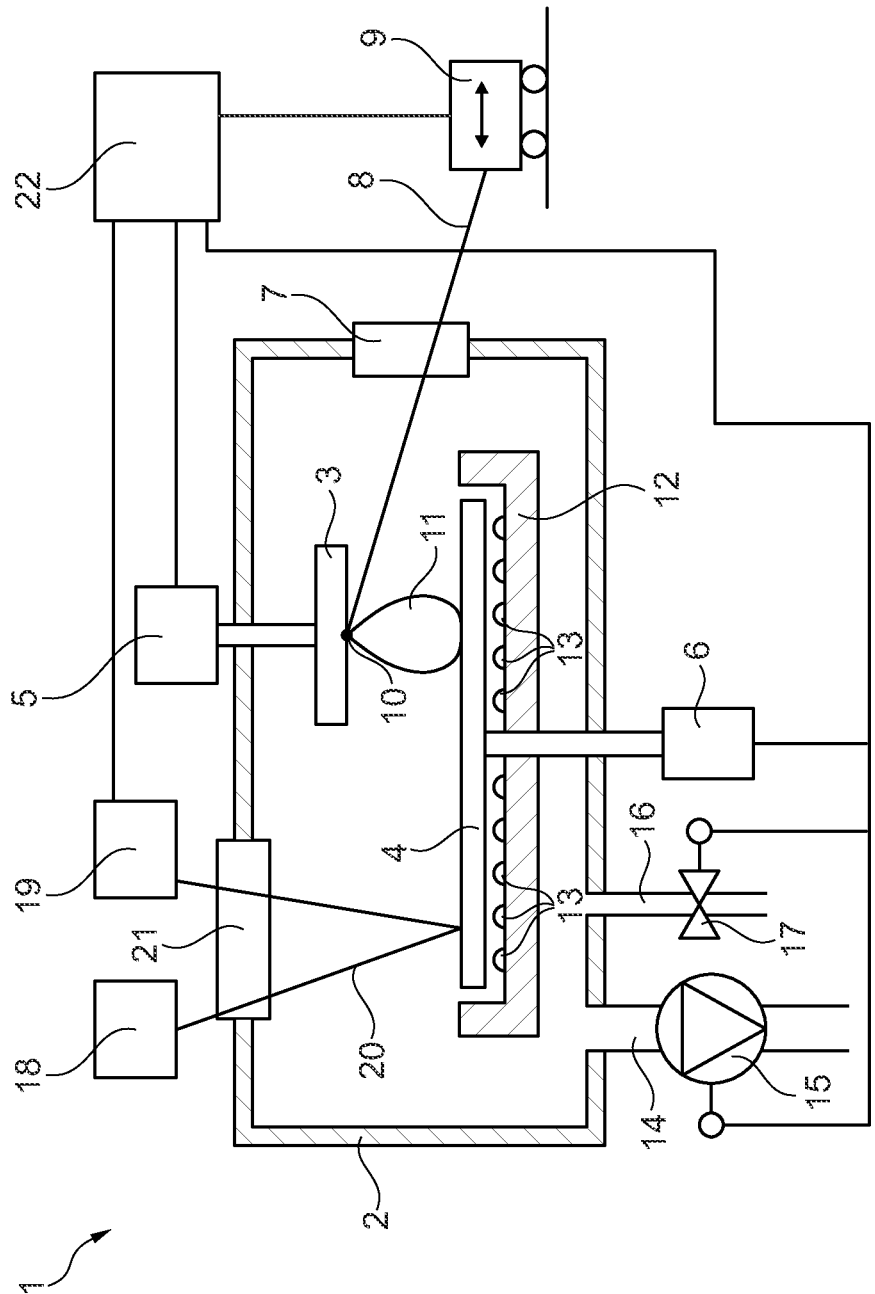
FIG. 1 shows a schematic view of a laser deposition device for a method according to the invention.

FIG. 1 shows a laser deposition device 1 for a method according to the invention. The laser deposition device 1 has a chamber 2, in which a target holder with a target 3 and a substrate holder and a substrate 4 are arranged. The target 3 is rotatable by a motor 5 and the substrate 4 is rotatable by a motor 6.

The chamber 2 is provided with a first window 7 through which a laser beam 8 of a laser 9 is directed onto the target 3 at a target spot 10 to generate a plasma plume 11, which is deposited onto the substrate 4. The laser 9 is movable in radial direction, such that the target spot 10 is moved in radial direction relative to the substrate 4.

The substrate 4 is heated by a heater 12, which has discrete heating elements 13, such that only a part of the substrate 4 can be heated.

A drain 14 with a vacuum pump 15 is connected to the chamber 2 in order to obtain a low pressure in the chamber 2. A gas supply 16 with a valve 17 is also connected to the chamber 2 to provide an atmosphere of a certain gas in the chamber 2.

Furthermore a wafer bow meter 18, 19 is provided, which directs a laser beam 20 through a second window 21 in the chamber 2 to measure the bending of the substrate 4 and derive therefrom the stress of the deposited thin film on the substrate 4.

A controller 22 is provided to control the movement of the laser 9, the rotation of the target 3, the rotation of the substrate 4, control the vacuum pump 15 and the gas supply 16 in order to perform the method according to the invention. Also the measurements of the wafer bow meter 18, 19 are supplied to the controller 22 to provide feed back of the thin film stress on the substrate 4.

Figure 2A:
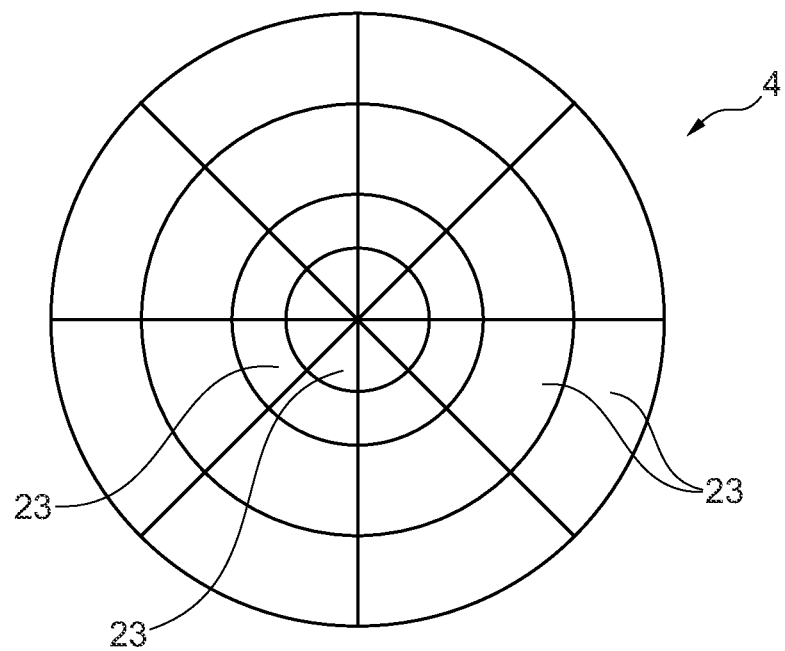
FIGS. 2A and 2B show a schematic top view of two embodiments of substrates for a method according to the invention.
Figure 2B:
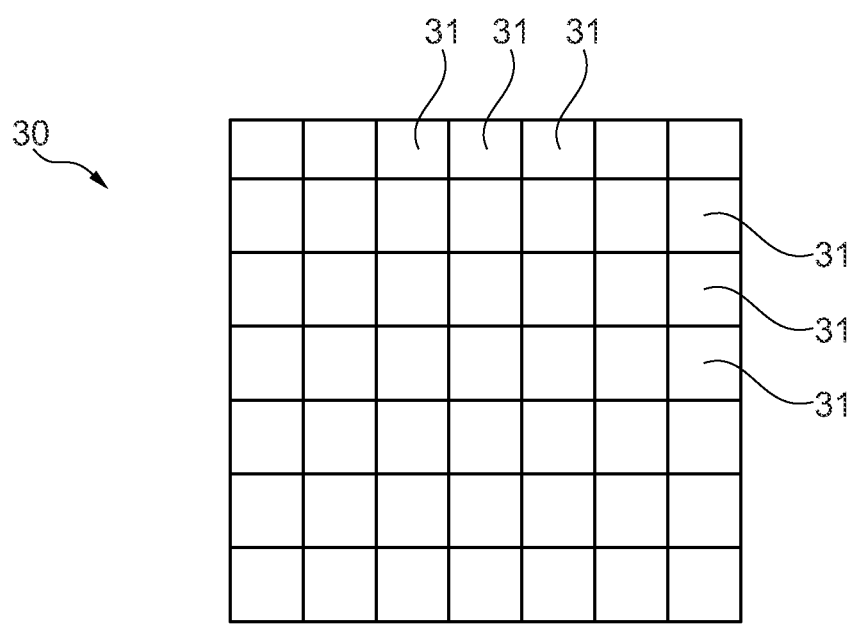

FIG. 2B shows a top view of a rectangular substrate 30 with defined discrete surface portions 31, which compose a grid in longitudinal and transverse direction. Typically, such a rectangular substrate 30 is moved in X and Y direction in order to align each of the discrete surface portions 31 with the target spot.

FIG. 2A shows a top view of a disc shaped substrate 4 with defined discrete surface portions 23, which compose a grid in radial and tangential direction. Typically such a disc shaped substrate 4 is rotated in order to move the target spot above each of the discrete surface portions 23.

Figure 3:
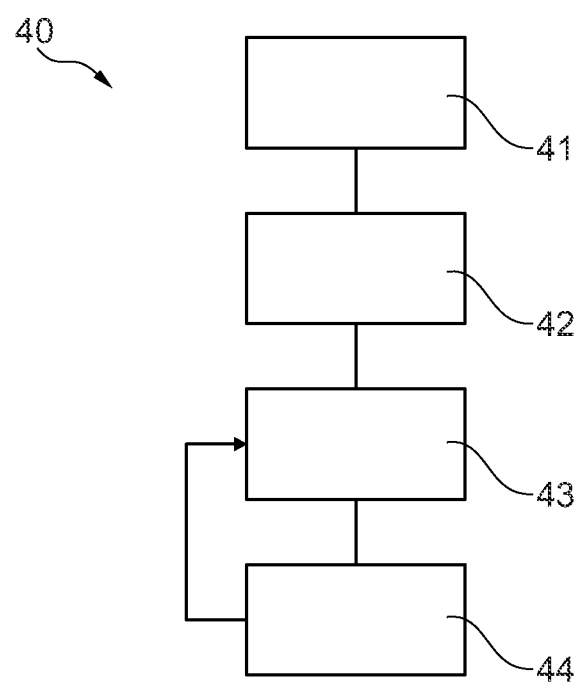
FIG. 3 shows a diagram of a first embodiment of the method according to the invention.

FIG. 3 shows a diagram 40 of a first embodiment of the method according to the invention. The diagram 40 starts with the step 41 of providing a laser deposition device, such as shown in FIG. 1. Then the method defines in step 42 a plurality of discrete surface portions 23 on the substrate 4 as shown in FIG. 2A.

The target spot 10 is then, in step 43, aligned with a discrete surface portion 23 on the substrate 4 and a plasma plume of target material 3 is generated and deposited onto the discrete surface portion 23.

Then the parameters of the deposition process are adjusted for the next discrete surface portion 23 in step 44, after which step 43 is repeated. The adjustment of the parameters of the deposition process could be adjusting the temperature of the substrate with the heater 12, 13, supplying gas with the gas supply 16 or controlling the vacuum with the vacuum pump 14. The adjustment of the parameters could be controlled by the measurements of the wafer bow meter 18, 19.

Figure 4:
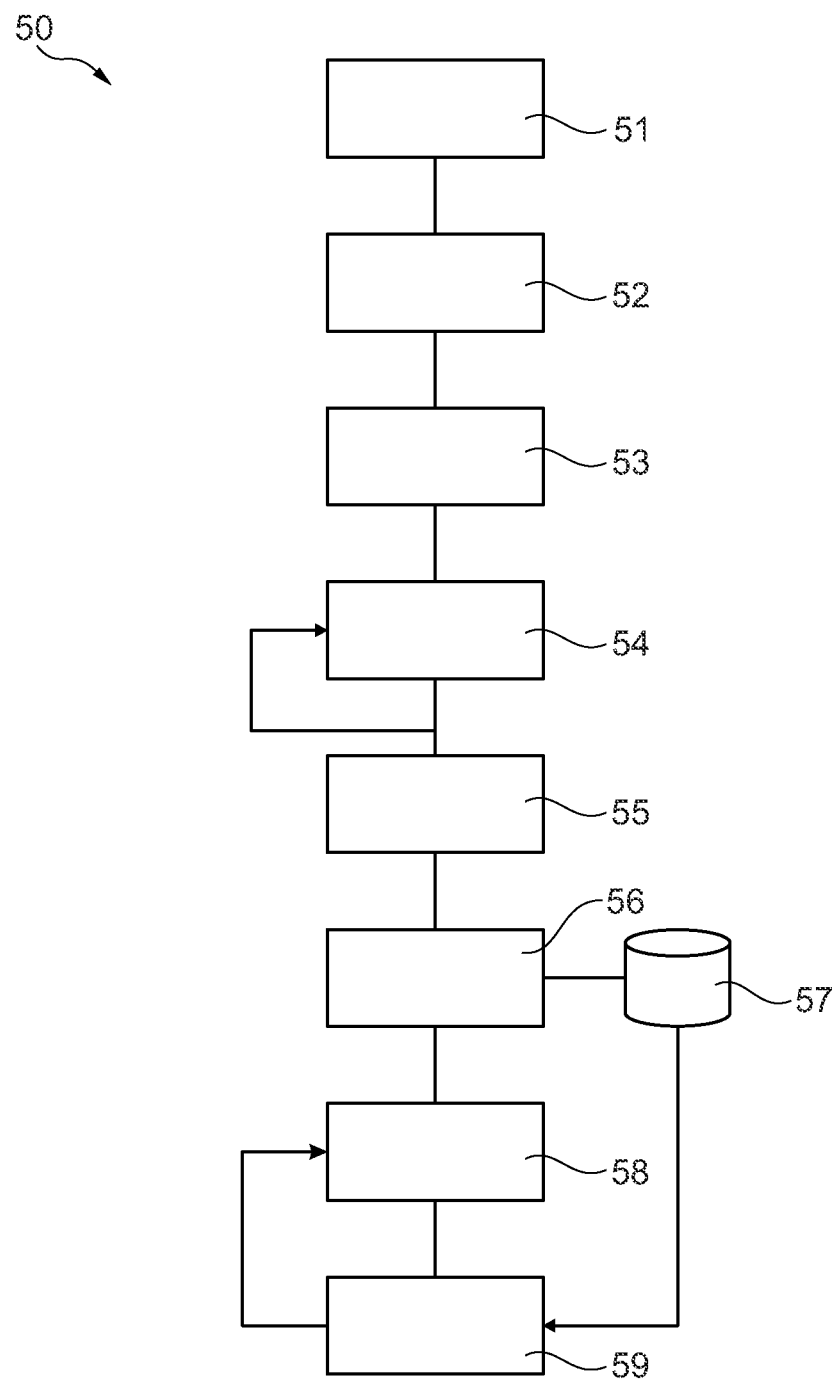
FIG. 4 shows a diagram of a second embodiment of the method according to the invention.

FIG. 4 shows a diagram 50 of a second embodiment. In this method 50, a deposition device 1 as shown for example in FIG. 1 is provided in step 51. Then in step 52 a first substrate is provided in the deposition device 1, on which a plurality of discrete surface portions 23 are defined in step 53 and as shown in FIG. 2A.

In step 54 the target spot is aligned one after the other with each of the plurality of discrete surface portions 23 and a plasma plume is generated to deposit target material on each of the plurality of discrete surface portions. During this deposition on the first substrate the parameters of the deposition process are kept constant.

After the deposition process has covered all of the plurality of discrete surface portions 23, the stress of the first substrate is measured in step 55. These measurements are then compared with a desired stress profile and adjustment parameters are calculated therefrom in step 56 and stored in a database 57.

Then with a second substrate, the deposition process is repeated for each discrete surface portion 23 in step 58, wherein after each deposition on a discrete surface portion 23 the parameters for the deposition process are adjusted with the parameters stored in the database 57 in step 59. The adjusting and deposition is then repeated for each discrete surface portion 23 on order to cover the whole second substrate and reduce the thin film stress on the substrate.

The invention claimed is:

1. A method for performing a laser deposition process, the method comprising:
    defining a plurality of discrete surface portions on a substrate in a chamber of a deposition device, the deposition device being configured to direct a laser beam through a window of the chamber onto a target spot at a target positioned in the chamber to generate a plasma plume of target material to form a thin film of target material on the substrate;
    aligning the target spot with a first discrete surface portion of the plurality of discrete surface portions and generating the plasma plume to deposit target material on the first discrete surface portion of the plurality of discrete surface portions; and
    for each additional discrete surface portion of one or more additional discrete surface portions on the substrate, aligning the target spot with the additional discrete surface portion and adjusting at least one parameter of a plurality of parameters of the laser deposition process depending on the additional discrete surface portion of the plurality of discrete surface portions with which the target spot is aligned to deposit the target material on the additional discrete surface portion, such that, by adjusting the at least one parameter during the laser deposition process, a specific deposition pattern is obtained over a surface of the substrate to control a uniformity of stress of the thin film across the substrate and thereby control a bending of the substrate from stress,
    the plurality of parameters comprising temperature, pressure, laser beam pulse duration, laser beam power, distance of target to substrate, spotsize and RF ionization energy.

2. The method according to claim 1, wherein defining the plurality of discrete surface portions of the substrate comprises defining the plurality of discrete surface portions as a two-dimensional grid in longitudinal and transverse direction or in radial and tangential directions.

3. The method according to claim 2, further comprising:
    measuring the stress in the thin film on the substrate;
    performing a comparison of the stress measured with a desired stress profile for the thin film; and
    taking into account the comparison while adjusting at least one of the parameters of the laser deposition process.

4. The method according to claim 3, wherein measuring the stress in the thin film comprises measuring the stress in the thin film in situ with a wafer bow meter, and wherein adjusting the at least one parameter of the plurality of parameters of the laser deposition process comprises adjusting the at least one parameter based at least upon the measuring of the stress in situ with the wafer bow meter.

5. The method according to claim 3, further comprising controlling the temperature of the substrate at the additional discrete surface portion by laser heating.

6. The method according to claim 3, further comprising supplying a controlled gas flow to a nozzle directed towards the additional discrete surface portion in order to adjust the pressure for the laser deposition process.

7. The method according to claim 2, further comprising supplying a controlled gas flow to a nozzle directed towards the additional discrete surface portion to adjust the pressure for the laser deposition process.

8. The method according to claim 1, further comprising:
measuring the stress in the thin film deposited on the substrate;
performing a comparison of the stress measured with a desired stress profile for the thin film; and
taking into account the comparison while adjusting at least one of the parameters of the laser deposition process.

9. The method according to claim 8, wherein measuring the stress in the thin film comprises measuring the stress in the thin film in situ with a stress measuring device.

10. The method according to claim 8, further comprising supplying a controlled gas flow to a nozzle directed towards the additional discrete surface portion to adjust the pressure for the laser deposition process.

11. The method according to claim 1, further comprising adjusting the temperature at the additional discrete surface portion by laser heating.

12. The method according to claim 1, further comprising supplying a controlled gas flow to a nozzle directed towards the additional discrete surface portion with which the target spot is aligned to adjust the pressure for the laser deposition process.

13. The method according to claim 1, further comprising adjusting the temperature of the substrate at the additional discrete surface portion by laser heating.

14. A method for performing a laser deposition process, the method comprising:
directing a laser beam onto a target spot at a target positioned in a chamber to generate a plasma plume of target material in order to form a thin film of target material on a first substrate positioned on a substrate holder in the chamber, wherein the target spot is movable relative to the substrate holder;
measuring film stress in the thin film on the first substrate;
defining, on the first substrate, a first plurality of discrete surface portions;
calculating adjustments for a parameter of the laser deposition process per discrete surface portion of the first plurality of discrete surface portions based on the stress measured;
defining, on a second substrate, a second plurality of discrete surface portions;
aligning the target spot with a first discrete surface portion of the second plurality of discrete surface portions and generating the plasma plume to deposit the target material on the second substrate at the first discrete surface portion of the second plurality of discrete surface portions; and
aligning the target spot with a second discrete surface portion of the second plurality of discrete surface portions, adjusting the parameter depending on the adjustments for the second discrete surface portion, and generating the plasma plume to deposit the target material on the second substrate at the second discrete surface portion of the second plurality of discrete surface portions such that, by adjusting the parameter during the laser deposition process, a specific deposition pattern is obtained over a surface of the second substrate to control a uniformity of a second thin film across the second substrate and thereby control a bending of the second substrate from stress, the parameter comprising temperature, pressure, laser beam pulse duration, laser beam power, distance of target to substrate, spotsize, or RF ionization energy.

15. The method according to claim 14, further comprising adjusting the temperature of the second substrate at the second discrete surface portion by laser hearting.

16. The method according to claim 14, further comprising supplying a controlled gas flow to a nozzle directed towards the second discrete surface portion to adjust the pressure for the laser deposition process.

17. A laser deposition device, comprising:
a chamber;
a target holder configured to hold a target material;
a substrate holder configured to hold a substrate; and
a laser configured to direct a laser beam toward a target spot of the target material positioned on the target holder to generate a plasma plume of target material, wherein the target spot is movable relative to the substrate holder in order to deposit target material onto a plurality of discrete surface portions of the substrate,
wherein the laser deposition device is configured to, during a laser deposition process:
align the target spot with a first discrete surface portion of the plurality of discrete surface portions and generate the plasma plume to deposit target material on the first discrete surface portion of the plurality of discrete surface portions;
for each additional discrete surface portion of one or more additional discrete surface portions on the substrate, align the target spot with the additional discrete surface portion and adjust at least one parameter of a plurality of parameters of the laser deposition device depending on the additional discrete surface portion of the plurality of discrete surface portions with which the target spot is aligned to deposit the target material on the additional discrete surface portion such that, by adjusting the at least one parameter during the laser deposition process, a specific deposition pattern for a thin film is obtained over a surface of the substrate to control form a uniformity of the thin film across the plurality of discrete surface portions on the substrate and thereby control a bending of the substrate from stress, the plurality of parameters comprising temperature, pressure, laser beam pulse duration, laser beam power, distance of target to substrate, spotsize and RF ionization energy.

18. The laser deposition device of claim 17, further comprising a stress measuring device configured to measure the stress in the thin film in situ.

19. The laser deposition device of claim 17, wherein the laser deposition device is further configured to control the temperature at the additional discrete surface portion by laser heating.

20. The laser deposition device of claim 17, further comprising a nozzle directed towards the additional discrete surface portion with which the target spot is aligned, and wherein the laser deposition device is further configured to supply a controlled gas flow to the nozzle to adjust the pressure of the laser deposition device.

* * * * *